(12) United States Patent
Kang et al.

(10) Patent No.: US 9,793,250 B2
(45) Date of Patent: Oct. 17, 2017

(54) PACKAGE BOARD, METHOD FOR MANUFACTURING THE SAME AND PACKAGE ON PACKAGE HAVING THE SAME

(71) Applicant: SAMSUNG ELECTRO-MECHANICS CO., LTD., Suwon-Si, Gyeonggi-Do (KR)

(72) Inventors: Myung Sam Kang, Suwon-Si (KR); Young Gwan Ko, Suwon-Si (KR); Hye Jin Kim, Suwon-Si (KR); Hye Won Jung, Suwon-Si (KR); Min Jae Seong, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 224 days.

(21) Appl. No.: 14/692,101

(22) Filed: Apr. 21, 2015

(65) Prior Publication Data

US 2016/0081182 A1    Mar. 17, 2016

(30) Foreign Application Priority Data

Sep. 17, 2014  (KR) .................. 10-2014-0123862

(51) Int. Cl.
| | |
|---|---|
| *H05K 1/11* | (2006.01) |
| *H05K 1/14* | (2006.01) |
| *H01L 25/10* | (2006.01) |
| *H05K 3/46* | (2006.01) |
| *H01L 23/13* | (2006.01) |
| *H01L 23/498* | (2006.01) |
| *H01L 23/14* | (2006.01) |

(52) U.S. Cl.
CPC ............ *H01L 25/105* (2013.01); *H01L 23/13* (2013.01); *H01L 23/49811* (2013.01); *H01L 23/49827* (2013.01); *H05K 3/4682* (2013.01); *H01L 23/147* (2013.01); *H01L 2224/16225* (2013.01); *H01L 2224/48225* (2013.01); *H01L 2225/1023* (2013.01); *H01L 2225/1058* (2013.01); *H01L 2924/15311* (2013.01); *H05K 3/4697* (2013.01)

(58) Field of Classification Search
CPC . H01L 2224/16225; H01L 2224/48225; H01L 23/13; H01L 23/147; H01L 23/49811; H01L 23/49827; H01L 25/105; H05K 3/4682; H05K 3/4697
See application file for complete search history.

(56) References Cited

U.S. PATENT DOCUMENTS

| | | | |
|---|---|---|---|
| 5,986,209 A | 11/1999 | Tandy | |
| 8,883,563 B1 * | 11/2014 | Haba | .................. H01L 23/3128 438/112 |
| 2008/0006942 A1 * | 1/2008 | Park | ..................... H01L 25/105 257/738 |
| 2011/0024888 A1 * | 2/2011 | Pagaila | .................. H01L 23/13 257/686 |

(Continued)

*Primary Examiner* — Yuriy Semenenko
(74) *Attorney, Agent, or Firm* — NSIP Law

(57) ABSTRACT

There are provided a package board, a method for manufacturing the same, and a package on package having the same. The package board according to an exemplary embodiment of the present disclosure includes a first insulating layer formed with a cavity having a penetrating shape; and a first connection pad formed to penetrate through the first insulating layer and formed at one side of the cavity.

10 Claims, 8 Drawing Sheets

(56) References Cited

U.S. PATENT DOCUMENTS

| | | | |
|---|---|---|---|
| 2011/0024899 A1* | 2/2011 | Masumoto | H01L 23/49816 257/737 |
| 2011/0285009 A1* | 11/2011 | Chi | H01L 21/561 257/693 |
| 2013/0249115 A1* | 9/2013 | Lin | H01L 23/13 257/777 |
| 2016/0027766 A1* | 1/2016 | Chung | H01L 23/49811 438/107 |

* cited by examiner

PACKAGE BOARD, METHOD FOR MANUFACTURING THE SAME AND PACKAGE ON PACKAGE HAVING THE SAME

CROSS-REFERENCE TO RELATED APPLICATION

This application claims the benefit of Korean Patent Application No. 10-2014-0123862, filed on Sep. 17, 2014, entitled "Package Board, Method For Manufacturing The Same And Package On Package Having The Same" which is hereby incorporated by reference in its entirety into this application.

BACKGROUND

The present disclosure relates to a package board, a method for manufacturing the same, and a package on package having the same.

Recently, electronic industries have adopted a mounting technology of using a multi-layer printed circuit board which may be highly densified and integrated at the time of mounting components to implement small and thin electronic devices. The high-density and high-integration multi-layer printed circuit board has been implemented by advancement in element technology which may implement micro circuits, bumps, and the like on a substrate. Recently, a semiconductor package such as a system in package (SIP), a chip sized package (CSP), and a flip chip package (FCP) configured as a package by mounting electronic devices on a printed circuit board in advance has been actively developed. Further, a package on package (POP) in which a control device and a memory device are implemented as one package form to improve miniaturization and performance of a high-performance smart phone has been developed. The package on package may be implemented by individually packaging the control device and the memory device and then stacking and connecting them.

RELATED ART DOCUMENT

Patent Document (Patent Document 1) U.S. Pat. No. 5,986,209

SUMMARY

An aspect of the present disclosure may provide a package board capable of reducing an overall thickness of a package on package, a method for manufacturing the same, and a package on package having the same.

Another aspect of the present disclosure may provide a package board capable of reducing bridge defect of an external connection terminal and easily implementing a fine pitch, a method for manufacturing the same, and a package on package having the same.

According to an aspect of the present disclosure, a package board may include a first insulating layer formed with a cavity having a penetrating shape; and a first connection pad formed to penetrate through the first insulating layer and formed at one side of the cavity.

The package board may further include a second connection pad formed on the first connection pad and the first insulating layer and formed to be exposed to the outside.

The second connection pad may be formed to have a diameter larger than that of the first connection pad.

The first connection pad may include a metal post; and a barrier layer formed to be bonded to a lower surface of the metal post.

The package board may further include a second insulating layer formed beneath the first insulating layer; and a first circuit pattern formed inside the second insulating layer.

An upper surface of the first circuit pattern may be exposed to the outside by the cavity.

BRIEF DESCRIPTION OF DRAWINGS

The above and other aspects, features and other advantages of the present disclosure will be more clearly understood from the following detailed description taken in conjunction with the accompanying drawings, in which.

DESCRIPTION OF EMBODIMENTS

Figure 1:
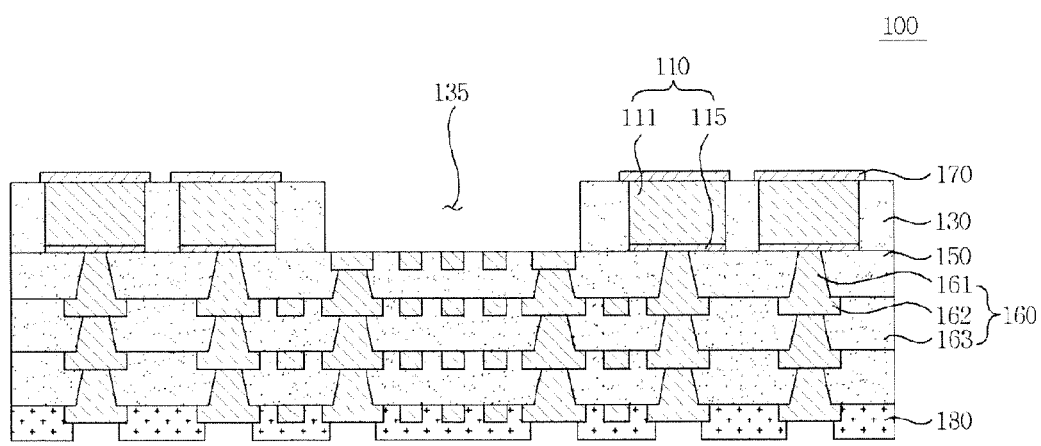
FIG. 1 is an exemplified diagram illustrating a package board according to an exemplary embodiment of the present disclosure.

The objects, features and advantages of the present disclosure will be more clearly understood from the following detailed description of the exemplary embodiments taken in conjunction with the accompanying drawings. Throughout the accompanying drawings, the same reference numerals are used to designate the same or similar components, and redundant descriptions thereof are omitted. Further, in the following description, the terms "first," "second," "one side," "the other side" and the like are used to differentiate a certain component from other components, but the configuration of such components should not be construed to be limited by the terms. Further, in the description of the present disclosure, when it is determined that the detailed description of the related art would obscure the gist of the present disclosure, the description thereof will be omitted.

Hereinafter, exemplary embodiments of the present disclosure will be described in detail with reference to the accompanying drawings.

FIG. 1 is an exemplified diagram illustrating a package board according to an exemplary embodiment of the present disclosure.

Referring to FIG. 1, a package board 100 according to an exemplary embodiment of the present disclosure includes a first insulating layer 130, a first connection pad 110, a second connection pad 170, a second insulating layer 150, a first circuit pattern 140, a build up layer 160, and a protective layer 180.

According to the exemplary embodiment of the present disclosure, the first insulating layer 130 is made of a composite polymer resin which is generally used as an interlayer insulating material. For example, the first insulating layer 130 may be made of the epoxy based resin, such as prepreg, ajinomoto build up film (ABF), FR-4, and bismaleimide triazine (BT). However, according to the exemplary embodiment of the present disclosure, the material forming the first insulating layer 130 is not limited thereto. According to the exemplary embodiment of the present disclosure, the first insulating layer 130 may be selected from insulating materials known in the circuit board field.

According to the exemplary embodiment of the present disclosure, a cavity 135 is formed in the first insulating layer 130. The cavity 135 is formed to penetrate through the first insulating layer 130. According to the exemplary embodiment of the present disclosure, electronic components (not illustrated) such as electronic devices are disposed in the cavity 135. That is, the electronic components (not illustrated) are disposed inside the package board 100. The existing package was formed package board and electronic components (not illustrated) disposed on the package board. However, according to the exemplary embodiment of the present disclosure, the electronic components (not illustrated) are inserted into the package board 100 to form a package. Therefore, a thickness of the package using the package board 100 according to the exemplary embodiment of the present disclosure is thinner than that of the existing package.

According to the exemplary embodiment of the present disclosure, the first connection pad 110 is formed to penetrate through the first insulating layer 130. Further, the first connection pad 110 is formed in a double structure including a first metal post 111 and a barrier layer 115.

According to the exemplary embodiment of the present disclosure, the first connection pad 110 is made of conductive materials which are generally used in a circuit board field. For example, the first connection pad 110 may be made of copper.

According to the exemplary embodiment of the present disclosure, the barrier layer 115 is formed at a lower portion of the first connection pad 110. The barrier layer 115 is made of a material different from that of the first connection pad 110, among the conductive materials which are generally used in a circuit board field. According to the exemplary embodiment of the present disclosure, the barrier layer 115 is made of conductive materials which do not react to etching materials to which the first connection pad 110 reacts. For example, if it is assumed that the first connection pad 110 is made of copper, the barrier layer 115 is made of nickel or titanium. As illustrated in FIG. 1, the barrier layer 115 is formed to have relatively thinner thickness than that of the first metal post 111. However, the barrier layer 115 is not necessarily formed to have a thinner thickness than that of the first connection pad 110.

According to the exemplary embodiment of the present disclosure, at the time of forming the package on package (not illustrated), an interval between the package board 100 and another package board (not illustrated) is narrow by the cavity 135 formed to penetrate through the first insulating layer 130 and the first connection pad 110. A size of the external connection terminal (not illustrated) for connecting to a lower package board may be reduced as much as the reduced interval. Therefore, the overall thickness of the package on package (not illustrated) is reduced. Further, it is advantageous to cope with a fine pattern due to the reduced size of the external connection terminal (not illustrated).

According to the exemplary embodiment of the present disclosure, the second connection pad 170 is formed on an upper surface of the first connection pad 110 and is bonded to the first connection pad 110. According to the exemplary embodiment of the present disclosure, the second connection pad 170 is made of conductive materials which are generally used in a circuit board field. For example, the second connection pad 170 may be made of copper.

According to the exemplary embodiment of the present disclosure, the second connection pad 170 is formed to have a larger diameter than that of the first connection pad 110. When the second connection pad 170 is formed as described above, a bonded area to the external connection terminal (not illustrated) is increased. Therefore, an alignment between the package board 100 and the external connection terminal (not illustrated) is increased and an adhesion therebetween is increased.

The exemplary embodiment of the present disclosure illustrates and describes the second connection pad 170 formed on the upper surface of the first connection pad 110, but the second connection pad 170 is not necessarily formed. That is, the second connection pad 170 may be omitted according to a selection of those skilled in the art.

According to the exemplary embodiment of the present disclosure, the second insulating layer 150 is formed beneath the first insulating layer 130. According to the exemplary embodiment of the present disclosure, the second insulating layer 150 is made of the composite polymer resin which is generally used as the interlayer insulating material. For example, the second insulating layer 150 may be made of the epoxy based resin, such as prepreg, ajinomoto build up film (ABF), FR-4, and bismaleimide triazine (BT). However, according to the exemplary embodiment of the present disclosure, the material forming the second insulating layer 150 is not limited thereto. According to the exemplary embodiment of the present disclosure, the second insulating layer 150 may be selected from the insulating materials known in the circuit board field.

According to the exemplary embodiment of the present disclosure, the first circuit pattern 140 is formed to be embedded in the second insulating layer 150. Further, the first circuit pattern 140 is formed at a lower portion of the cavity 135 and an upper surface thereof is exposed to the outside by the cavity 135. According to the exemplary embodiment of the present disclosure, the first circuit pattern 140 is electrically connected to the electronic components (not illustrated) which are disposed in the cavity 135 later.

According to the exemplary embodiment of the present disclosure, the first circuit pattern 140 is made of the conductive materials which are generally used in a circuit board field. For example, the first circuit pattern 140 may be made of copper (Cu).

The exemplary embodiment of the present disclosure describes an example in which the first circuit pattern 140 electrically connected to the electronic components (not illustrated) and the second insulating layer 150 are formed. However, the first circuit pattern 140 and the second insulating layer 150 are not necessarily included in the package board 100. Further, the exemplary embodiment of the present disclosure describes an example in which the first circuit pattern 140 is formed only at the lower portion of the cavity 135. However, the first circuit pattern 140 is not necessarily positioned only at the lower portion of the cavity 135. That is, the first circuit pattern 140 and the second insulating layer 150 may be omitted according to a selection of those skilled in the art and a position at which the first circuit pattern 140 is formed may also be changed.

The build up layer 160 according to the exemplary embodiment of the present disclosure is formed under the second insulating layer 150. According to the exemplary embodiment of the present disclosure, the build up layer 160 includes a build up insulating layer 163 of at least one layer, a build up circuit pattern 162, and a build up via 161.

According to the exemplary embodiment of the present disclosure, the build up insulating layer 163 is formed under the second insulating layer 150. The build up insulating layer 163 is formed of a composite polymer resin which is generally used as an interlayer insulating material in the circuit board field.

Further, according to the exemplary embodiment of the present disclosure, the build up circuit pattern 162 is formed under the second insulating layer 150. Further, the build up circuit pattern 162 is formed inside and at a lower portion of the build up insulating layer 163. According to the exemplary embodiment of the present disclosure, the build up circuit pattern 162 is made of the conductive materials which are generally used in the circuit board field. For example, the build up circuit pattern 162 may be made of copper (Cu).

Further, according to the exemplary embodiment of the present disclosure, the build up via 161 is formed inside the second insulating layer 150 and the build up insulating layer 163. The build up via 161 penetrates through the second insulating layer 150 to electrically connect between the first circuit pattern 140 and the build up circuit pattern 162. Further, the build up via 161 is formed inside the build up insulating layer 163 to electrically connect between the multi-layered build up circuit patterns 162.

The exemplary embodiment of the present disclosure describes an example in which the build up layer 160 includes the multi-layered build up insulating layer 163, the build up circuit pattern 162, and the build up via 161. However, the number of layers of the build up insulating layer 163, the build up circuit pattern 162, and the build up via 161 may be changed and omitted according to a selection of those skilled in the art.

According to the exemplary embodiment of the present disclosure, the protective layer 180 is formed under the first insulating layer 130 and is thus formed to protect a circuit pattern formed at an outermost layer. Therefore, according to the exemplary embodiment of the present disclosure, the protective layer 180 is formed under the build up insulating layer 163 to protect the build up circuit pattern 162 formed at the outermost layer. In this case, the protective layer 180 is formed to expose a portion electrically connected to external components (not illustrated) among the plurality of build up circuit patterns 162 to the outside. Here, the external components (not illustrated) may be electronic devices, a package, a main board, and the like.

According to the exemplary embodiment of the present disclosure, the protective layer 180 is formed to protect the circuit pattern by a soldering process, and the like. Further, the protective layer 180 is formed to prevent the circuit pattern from being oxidized or corroding. According to the exemplary embodiment of the present disclosure, the protective layer 180 is made of a heat resistant covering material. For example, the protective layer 180 is formed of a solder resist.

The exemplary embodiment of the present disclosure describes an example in which the protective layer 180 is formed under the build up layer 160. However, when the build up layer 160 and the second insulating layer 150 are omitted, the circuit pattern formed at the outermost layer becomes the first circuit pattern 140. In this case, the protective layer 180 is formed under the first insulating layer 130 to protect the first circuit pattern 140. The position at which the protective layer 180 is formed is changed depending on whether the build up layer 160, the first circuit pattern 140, and the second insulating layer 150 are formed.

FIGS. 2 through 21 are exemplified diagrams illustrating a method for manufacturing a package board according to an exemplary embodiment of the present disclosure.

Figure 2:
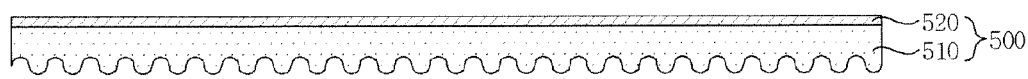
FIGS. 2 through 21 are exemplified diagrams illustrating a method for manufacturing a package board according to an exemplary embodiment of the present disclosure.

Referring to FIG. 2, a carrier substrate 500 is provided.

According to the exemplary embodiment of the present disclosure, when an insulating layer and a circuit layer for the package board are formed, the carrier substrate 500 is a component to support the insulating layer and the circuit layer.

According to the exemplary embodiment of the present disclosure, the carrier substrate 500 has a structure in which a carrier metal layer 520 is stacked on a carrier core 510.

For example, the carrier core 510 is made of an insulating material. However, a material of the carrier core 510 is not limited to an insulating material, but is made of a metal material or may have a structure in which the insulating layer and the metal layer are stacked in at least one layer.

For example, the carrier metal layer 520 may be made of copper. However, a material of the carrier metal layer 520 is not limited to copper, and therefore any conductive material which is used in the circuit board field may be applied without being limited.

Figure 3:
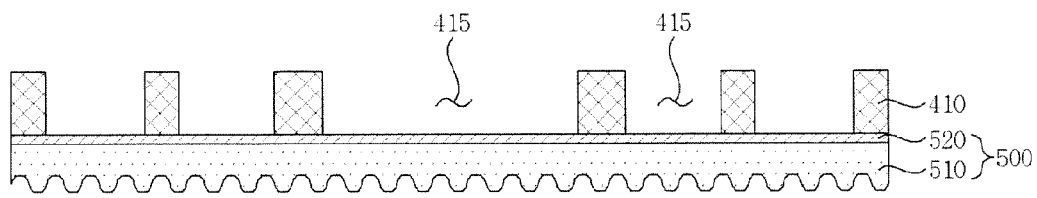

Referring to FIG. 3, a first plating resist 410 is formed.

According to the exemplary embodiment of the present disclosure, the first plating resist 410 is formed on the carrier metal layer 520 of the carrier substrate 500. According to the exemplary embodiment of the present disclosure, the first plating resist 410 includes a first plating opening 415. According to the exemplary embodiment of the present disclosure, the first plating opening 415 penetrates through the first plating resist 410 to expose the carrier metal layer 520 to the outside. Here, the first plating opening 415 is positioned at an upper portion in a region in which the first connection pad (not illustrated) and a cavity pattern (not illustrated) are formed. Further, the region in which the cavity pattern (not illustrated) is formed is formed to have a size enough to provide an insertion and a disposition of the electronic devices.

Figure 4:
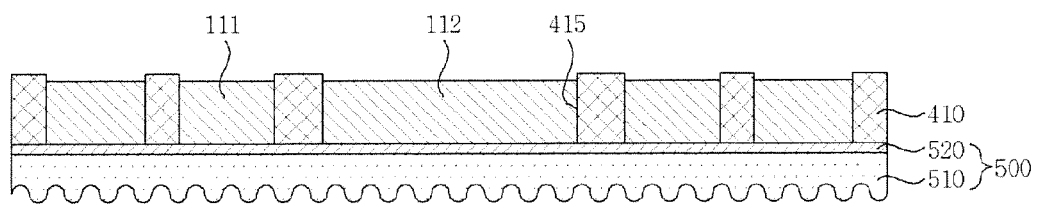

Referring to FIG. 4, the first metal post 111 and the second metal post 112 are formed on the carrier substrate 500.

According to the exemplary embodiment of the present disclosure, electroplating is performed on the first plating opening 415 of the first plating resist 410. In this case, the carrier metal layer 520 exposed through the first plating opening 415 of the first plating resist 410 may serve as a seed layer for the electroplating. As such, the plating is performed on the first plating resist 410 to form the first metal post ill and the second metal post 112 on the carrier substrate 500. In this case, the first plating opening 415 in the region in which the first connection pad (not illustrated) is formed is provided with the first metal post 111. Further, the first plating opening 415 in the region in which the cavity pattern (not illustrated) is formed is provided with the second metal post 112.

According to the exemplary embodiment of the present disclosure, the first metal post 111 and the second metal post 112 are made of the conductive materials which are used in the circuit board field. For example, the first metal post 111 and the second metal post 112 are made of copper.

The exemplary embodiment of the present disclosure describes an example in which the first metal post 111 and the second metal post 112 are formed by the electroplating method, but is not limited thereto. That is, the first metal post 111 and the second metal post 112 may also be formed by any of the methods for forming a circuit pattern or a metal post known in the circuit board field.

According to the exemplary embodiment of the present disclosure, the carrier metal layer 520 and the second metal post 112 are not necessarily made of the same materials. However, when the carrier metal layer 520 and the second metal post 112 are made of the same material, they may be removed using the same etchant during a later etching process and therefore the etching process may be simplified.

Figure 5:
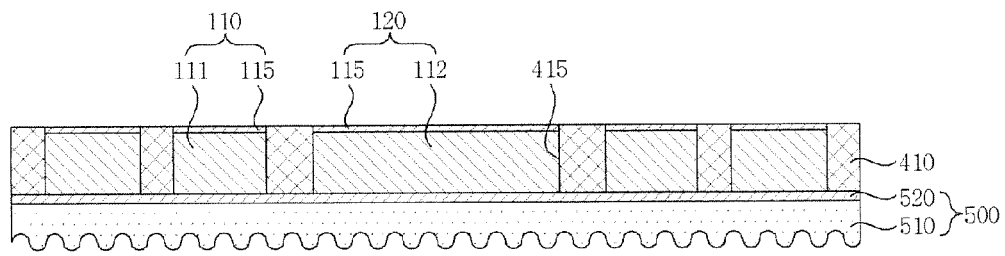

Referring to FIG. 5, the barrier layer 115 is formed.

According to the exemplary embodiment of the present disclosure, the barrier layer 115 is formed on the upper surfaces of the first metal post 111 and the second metal post 112 which are exposed to the outside by the first plating resist 410.

According to the exemplary embodiment of the present disclosure, the barrier layer 115 is made of different materials from those of the first metal post 111 and the second metal post 112 among conductive metals which are used in the circuit board field. According to the exemplary embodiment of the present disclosure, the barrier layer 115 is made of the conductive materials which do not react to the etching materials to which the first connection pad 110 reacts. For example, if it is assumed that the first connection pad 110 is made of copper, the barrier layer 115 is made of nickel or titanium.

According to the exemplary embodiment of the present disclosure, the barrier layer 115 is formed by the electroplating or a sputtering method. However, a method for forming a barrier layer 115 is not limited to the electroplating and the sputtering method. That is, the barrier layer 115 may be formed by any method for forming conductive materials which are known in the circuit board field.

As illustrated in FIG. 5, the barrier layer 115 is formed to have relatively thinner thickness than that of the first metal post 111. However, the barrier layer 115 is not necessarily formed to have a thinner thickness than that of the first metal post 111 and the second metal post 112.

According to the exemplary embodiment of the present disclosure, due to the formation of the barrier layer 115, the first connection pad 110 including the first metal post 111 and the barrier layer 115 and the cavity pattern 120 including the second metal post 112 and the barrier layer 115 are formed.

According to the exemplary embodiment of the present disclosure, the first connection pad 110 is a configuration part which is electrically connected to the outside configuration part. Further, when the package on package is formed, the cavity pattern 120 is formed to secure a space in which the electronic devices mounted on the lower package board are positioned. Therefore, when the cavity pattern 120 is removed later, the cavity pattern is formed to have a size enough to dispose the electronic devices in an empty space (cavity).

Figure 6:
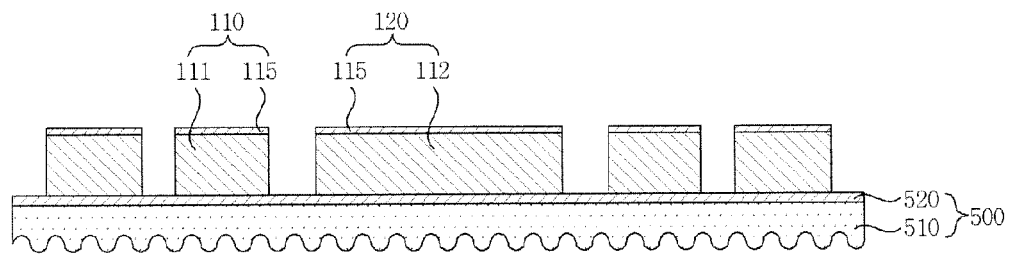

Referring to FIG. 6, the first plating resist 410 (FIG. 5) is removed.

Figure 7:
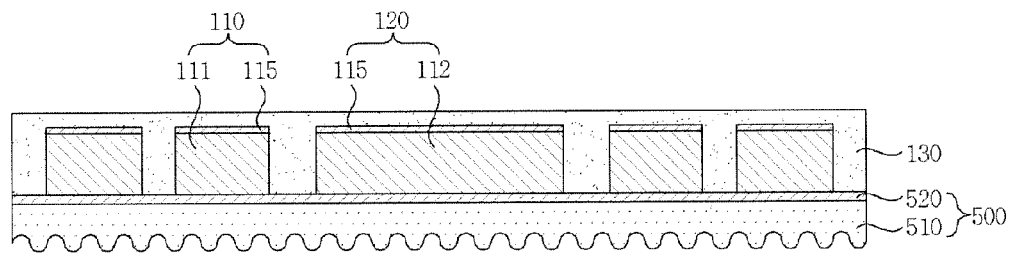

Referring to FIG. 7, the first insulating layer 130 is formed.

According to the exemplary embodiment of the present disclosure, the first insulating layer 130 is formed on the carrier metal layer 520 to cover the first connection pad 110 and the cavity pattern 120. According to the exemplary embodiment of the present disclosure, the upper surface of the first insulating layer 130 is formed to be at a higher position than the upper surface of the first connection pad 110 and the upper surface of the cavity pattern 120. That is, the first insulating layer 130 may also be formed on the first connection pad 110 and the cavity pattern 120, having a predetermined thickness.

According to the exemplary embodiment of the present disclosure, the first insulating layer 130 may be formed by a method for applying the first insulating layer 130 on the carrier metal layer 520 in a liquid form to embed the first connection pad 110 and the cavity pattern 120 in the first insulating layer 120. Alternatively, the first insulating layer 130 may be formed by a method for stacking the first insulating layer 130 on the carrier metal layer 520, the first connection pad 110, and the cavity pattern in a film form and pressing it. According to the exemplary embodiment of the present disclosure, the first insulating layer 130 may be formed by any method for forming an insulating layer in the circuit board field in addition to the foregoing methods.

According to the exemplary embodiment of the present disclosure, the first insulating layer 130 may be made of the composite polymer resin which is generally used as an interlayer insulating material. For example, the first insulating layer 130 may be made of the epoxy based resin, such as prepreg, ajinomoto build up film (ABF), FR-4, and bismaleimide triazine (BT). However, according to the exemplary embodiment of the present disclosure, the material forming the first insulating layer 130 is not limited thereto. According to the exemplary embodiment of the present disclosure, the first insulating layer 130 may be selected from insulating materials known in the circuit board field.

Figure 8:
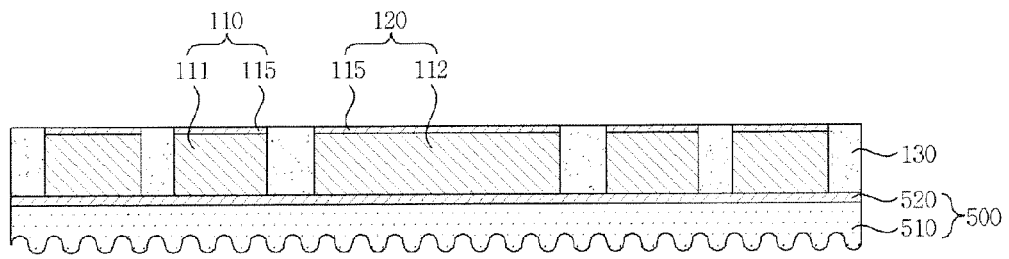

Referring to FIG. 8, the first insulating layer 130 is planarized.

According to the exemplary embodiment of the present disclosure, the first insulating layer 130 is polished. In this case, the first insulating layer 130 is polished to expose the upper surface of the first connection pad 110 and the upper surface of the cavity pattern 120 to the outside. According to the exemplary embodiment of the present disclosure, the first insulating layer 130 may be polished by any of the polishing methods which are known in the circuit board field. The upper surface of the first insulating layer 130 is planarized by the polishing process.

Figure 9:
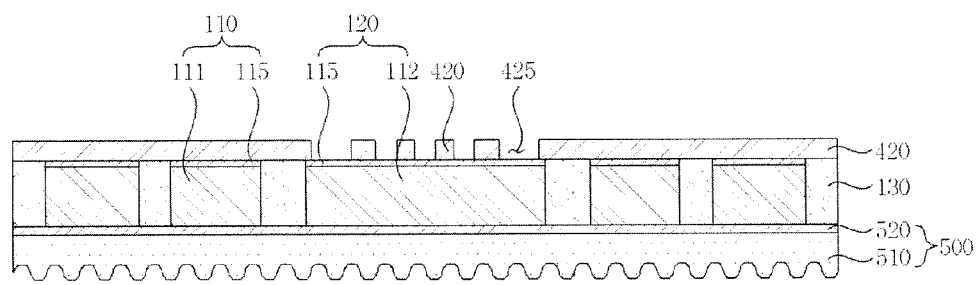

Referring to FIG. 9, the second plating resist 420 is formed.

According to the exemplary embodiment of the present disclosure, the second plating resist 420 is formed on the first insulating layer 130, the first connection pad 110, and the cavity pattern 120. According to the exemplary embodiment of the present disclosure, the second plating resist 420 includes a second plating opening 425. According to the exemplary embodiment of the present disclosure, the second plating opening 425 penetrates through the second plating resist 420 to expose a portion of the upper surface of the cavity pattern 120 to the outside. Here, the second plating opening 425 is positioned at the upper portion in the region in which the first circuit pattern (not illustrated) is formed.

According to the exemplary embodiment of the present disclosure, the second plating resist 420 is a photosensitive resist. Therefore, the second plating opening 425 is formed by an exposure and development process. The second plating opening 425 may be formed to correspond to a fine pitch by the exposure development process.

The exemplary embodiment of the present disclosure describes an example in which the second plating resist 420 is the photosensitive resist, but a material of the second plating resist 420 is not limited to have photosensitivity.

Figure 10:
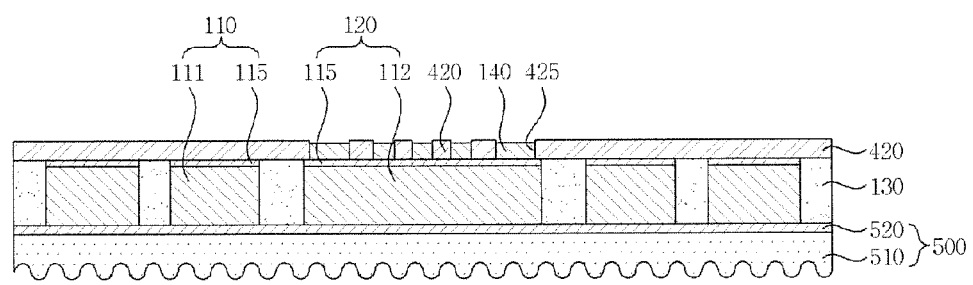

Referring to FIG. 10, the first circuit pattern 140 is formed.

According to the exemplary embodiment of the present disclosure, the first circuit pattern 140 is formed by performing the electroplating on the second plating opening 425 of the second plating resist 420.

According to the exemplary embodiment of the present disclosure, the first circuit pattern 140 is made of the conductive materials which are generally used in a circuit board field. In this case, the first circuit pattern 140 is made of a material which does not react to the etchant removing the barrier layer 115 later. For example, the first circuit pattern 140 is made of copper (Cu).

In addition, the exemplary embodiment of the present disclosure describes that the first circuit pattern 140 is formed by the electroplating method, but is not limited thereto. That is, the first circuit pattern 140 may be formed by any of the methods for forming a circuit pattern which is known in the circuit board field.

According to the exemplary embodiment of the present disclosure, the second plating resist 420 is the photosensitive resist and the second plating opening 425 corresponding to the fine pitch is formed by the exposure and development process. Since the first circuit pattern 140 is formed in the so formed second plating opening 425, the first circuit pattern 140 corresponding to the fine pitch may be implemented.

Figure 11:
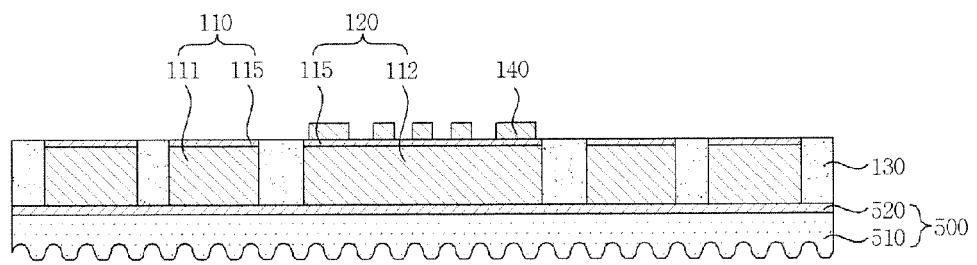

Referring to FIG. 11, the second plating resist 420 (FIG. 10) is removed.

Figure 12:
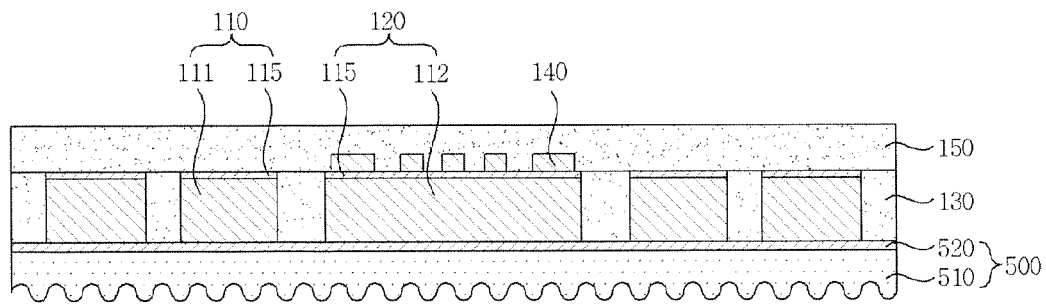

Referring to FIG. 12, the second insulating layer 150 is formed.

According to the exemplary embodiment of the present disclosure, the second insulating layer 150 is formed on the first insulating layer 130 to embed the first circuit pattern 140. In this case, the second insulating layer 150 is formed to have a predetermined thickness from the upper surface of the first circuit pattern 140.

According to the exemplary embodiment of the present disclosure, the second insulating layer 150 may be formed by a method for applying the second insulating layer 150 on the first insulating layer 130 in a liquid form to embed the first circuit pattern 140. Alternatively, the second insulating layer 150 may be formed by a method for stacking the second insulating layer 150 on the first insulating layer 130 and the first circuit pattern 140 in a film form and then pressing it. According to the exemplary embodiment of the present disclosure, the second insulating layer 150 may be formed by any method for forming an insulating layer in the circuit board field in addition to the foregoing methods.

According to the exemplary embodiment of the present disclosure, the second insulating layer 150 may be made of the composite polymer resin which is generally used as an interlayer insulating material. For example, the second insulating layer 150 may be made of an epoxy based resin, such as prepreg, ajinomoto build up film (ABF), FR-4, and bismaleimide triazine (BT). However, according to the exemplary embodiment of the present disclosure, the material forming the second insulating layer 150 is not limited thereto. According to the exemplary embodiment of the present disclosure, the second insulating layer 150 may be selected from the insulating materials known in the circuit board field.

Figure 13:
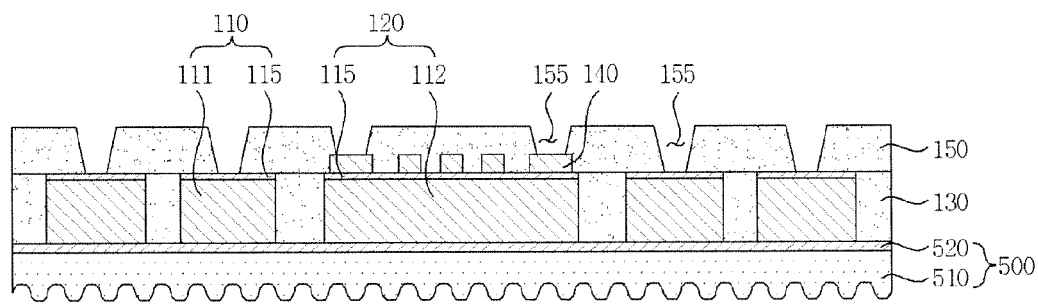

Referring to FIG. 13, the via hole 155 is formed.

According to the exemplary embodiment of the present disclosure, the via hole 155 is formed to penetrate through the second insulating layer 150. Further, according to the exemplary embodiment of the present disclosure, the via hole 155 is formed on the first connection pad 110 and the first circuit pattern 140, respectively. The position of the via hole 155 and the number of via holes 155 may be changed according to the selection of those skilled in the art.

According to the exemplary embodiment of the present disclosure, the via hole 155 is formed using a laser drill. Alternatively, when the second insulating layer 150 is a photosensitive material, the via hole 155 is formed by the exposure and development process.

Figure 14:
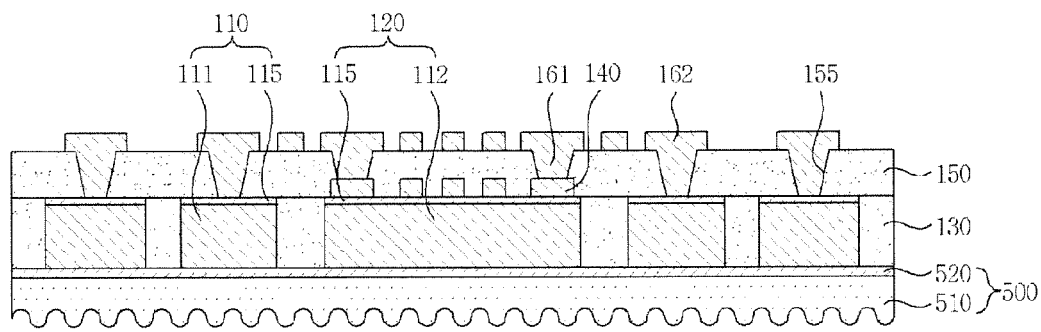

Referring to FIG. 14, the build up via 161 and the build up circuit pattern 162 are formed.

According to the exemplary embodiment of the present disclosure, the build up via 161 is formed in the via hole 155. Further, the build up circuit pattern 162 is formed on the second insulating layer 150.

According to the exemplary embodiment of the present disclosure, the build up via 161 and the build up circuit pattern 162 may be formed by any method for forming a via and a circuit pattern which is known in the circuit board field.

Further, according to the exemplary embodiment of the present disclosure, the build up via 161 and the build up circuit pattern 162 are made of the conductive materials which are used in the circuit board field. For example, the build up via 161 and the build up circuit pattern 162 are made of copper.

Figure 15:
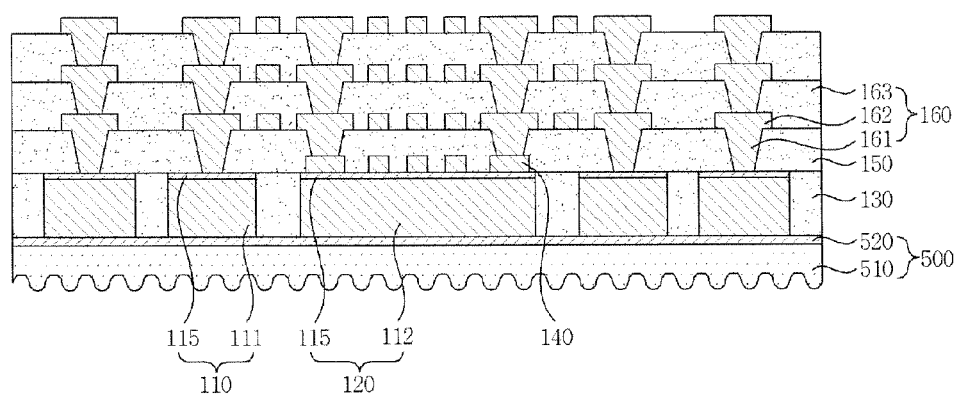

Referring to FIG. 15, the build up insulating layer 163 is formed.

According to the exemplary embodiment of the present disclosure, the build up insulating layer 163 is formed on the second insulating layer 150 to embed the build up circuit pattern 162.

According to the exemplary embodiment of the present disclosure, the build up insulating layer 163 is applied on the second insulating layer 150 in a liquid form or is stacked thereon in a film form. Further, the build up insulating layer 163 may be formed by any method for forming an insulating layer in the circuit board field in addition to the foregoing methods.

According to the exemplary embodiment of the present disclosure, the build up insulating layer 163 may be made of a composite polymer resin generally used as an interlayer insulating material. For example, the build up insulating layer 163 may be made of an epoxy based resin, such as prepreg, ajinomoto build up film (ABF), FR-4, and bismaleimide triazine (BT). However, according to the exemplary embodiment of the present disclosure, a material forming the build up insulating layer 163 is not limited thereto. The build up insulating layer 163 according to the exemplary embodiment of the present disclosure may be selected from the insulating materials known in the circuit board field.

The multi-layered build up layer 160 is formed by repeating the process of forming the build up via 161, the build up circuit pattern 162, and the build up insulating layer 163.

In FIG. 15, the build up via 161, the build up circuit pattern 162, and the build up insulating layer 163 are each formed in a three layer structure, but the number of layers of the configuration part of the build up layer 160 may be changed according to a selection of those skilled in the art. Further, the build up layer 160 may be omitted according to a selection of those skilled in the art. Further, the build up layer 160 and the second insulating layer 150 may be omitted according to a selection of those skilled in the art.

Figure 16:
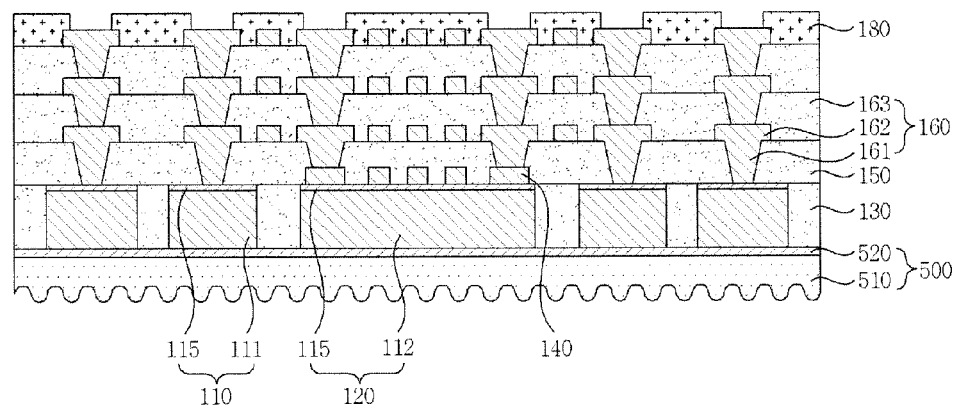

Referring to FIG. 16, the protective layer 180 is formed.

According to the exemplary embodiment of the present disclosure, the protective layer 180 is formed on an uppermost layer of the build up layer 160. That is, the protective layer 180 is formed on the build up insulating layer 163 which is the uppermost layer to protect the build up circuit pattern 162.

According to the exemplary embodiment of the present disclosure, when the build up circuit pattern 162 suffers from soldering for mounting electronic devices (not illustrated) later, the protective layer 180 may prevent the build up circuit pattern 162 from being applied with a solder. Further, the protective layer 180 may prevent the build up circuit pattern 162 from being oxidized and corroding.

According to the exemplary embodiment of the present disclosure, the protective layer 180 is formed to expose a portion of the build up circuit pattern 162. In this case, the build up circuit pattern 162 exposed by the protective layer 180 may be a region which is electrically connected to the external configuration part such as electronic devices.

According to the exemplary embodiment of the present disclosure, the protective layer 180 is made of a heat resistant covering material. For example, the protective layer 180 may be formed of a solder resist.

The exemplary embodiment of the present disclosure describes an example in which the protective layer 180 is formed on the build up layer 160, but when the build up layer 160 is omitted, the protective layer 180 may be formed on the second insulating layer 150. Alternatively, when the build up layer 160 and the second insulating layer 150 are omitted, the protective layer 180 may be formed on the first insulating layer 130. As such, the protective layer 180 is to protect the circuit pattern exposed to the outside, and therefore even though the package board is formed by any structure, the protective layer 180 may be formed to protect the circuit pattern which is formed at the outermost layer.

Figure 17:
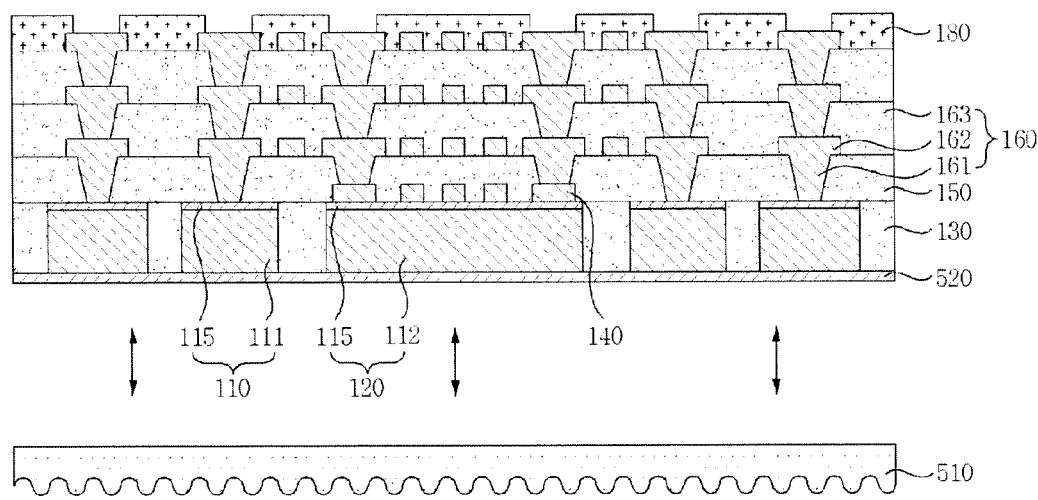

Referring to FIG. 17, the carrier core 510 is removed.

According to the exemplary embodiment of the present disclosure, the carrier core 510 and the carrier metal layer 520 are separated from each other and thus the carrier core 510 may be removed.

Figure 18:
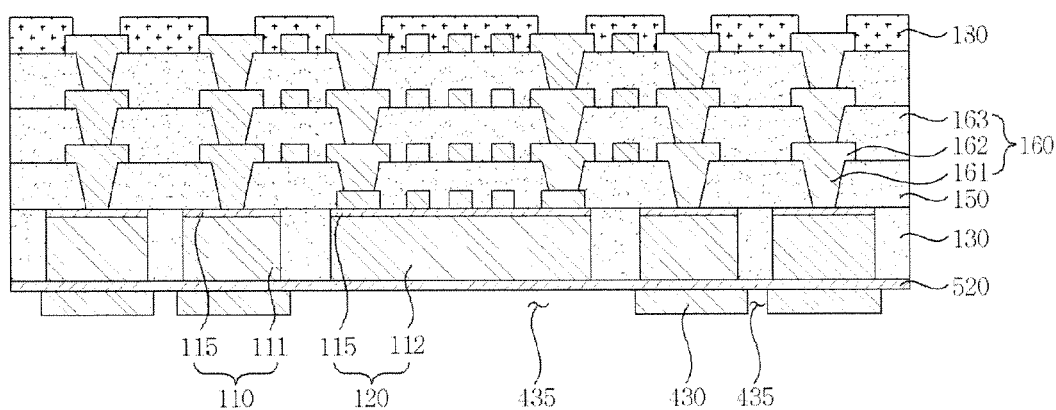

Referring to FIG. 18, the etching resist 430 is formed.

According to the exemplary embodiment of the present disclosure, when the cavity pattern 120 is etched later, the etching resist 430 is formed to prevent the first connection pad 110 from being damaged. Therefore, the etching resist 430 is formed under the first connection pad 110.

According to the exemplary embodiment of the present disclosure, the etching resist 430 is provided with the etching opening 435 to expose a region other than the region in which the first connection pad 110 is formed.

Figure 19:
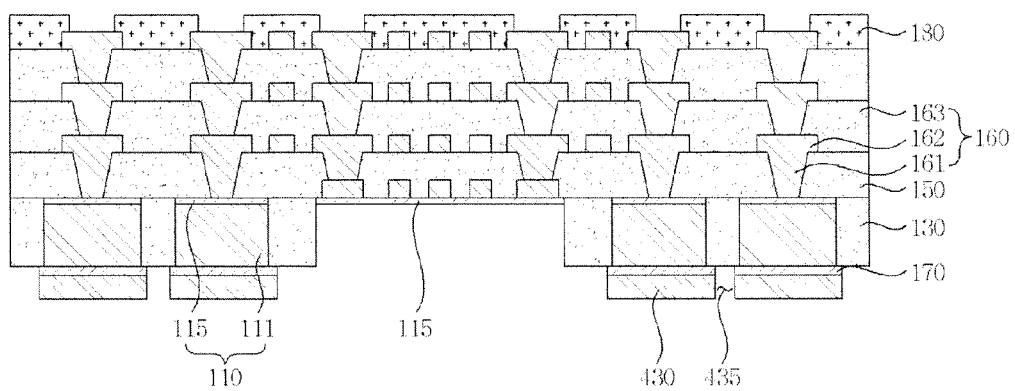

Referring to FIG. 19, a primary etching process is performed.

According to the exemplary embodiment of the present disclosure, the primary etching process removes the carrier metal layer 520 exposed to the outside by the etching opening 435 and the second metal post 112 (FIG. 18) of the cavity pattern 120 (FIG. 18). According to the exemplary embodiment of the present disclosure, when the carrier metal layer 520 and the second metal post 112 (FIG. 18) are made of the same material, the carrier metal layer 520 and the second metal post 112 may be simultaneously removed with the same chemicals.

According to the exemplary embodiment of the present disclosure, when the primary etching process is performed, the barrier layer 115 of the cavity pattern 120 (FIG. 18) made of a different material from that of the second metal post 112 (FIG. 18) remains.

Further, according to the exemplary embodiment of the present disclosure, the carrier metal layer 520 exposed to the outside is removed by the primary etching process and the carrier metal layer 520 on the etching resist 430 remains. As such, the carrier metal layer 520 is patterned and thus the second connection pad 170 is formed under the first connection pad 110. According to the exemplary embodiment of the present disclosure, the second connection pad 170 may be formed to have a larger diameter than that of the first connection pad 110. Due to the so formed second connection pad 170, a bonded area is larger than when the external connection terminal is directly bonded to the first connection pad 110.

Figure 20:
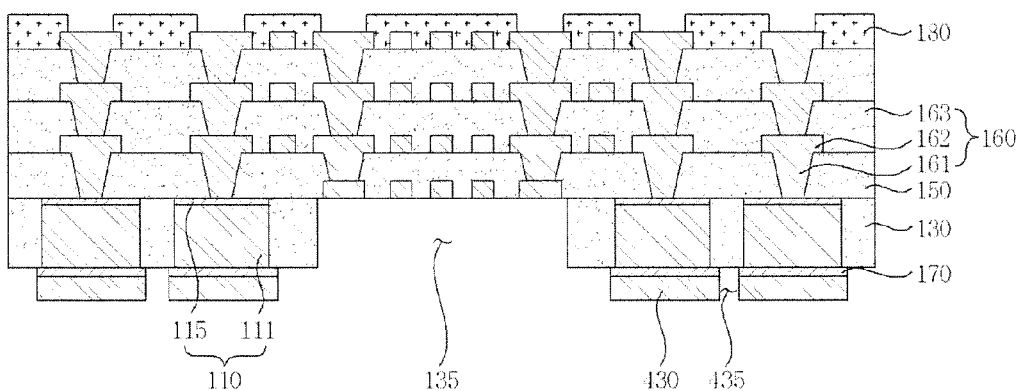

Referring to FIG. 20, a secondary etching process is performed.

According to the exemplary embodiment of the present disclosure, the barrier layer 115 exposed to the outside is removed by the secondary etching process. In this case, the first circuit pattern 140 is made of a different material from that of the barrier layer 115. That is, the first circuit pattern 140 does not react to the etchant to which the barrier layer 115 reacts. Therefore, when the barrier layer 115 is removed by the secondary etching process, the first circuit pattern 140 remains without being removed.

As such, the second connection pad 170 and the cavity 135 are formed by the primary etching process and the secondary etching process.

Although not illustrated in the exemplary embodiment of the present disclosure, when the primary etching process and the secondary etching process are performed, the etching protective layer (not illustrated) is further formed on the protective layer 180. The etching protective layer (not illustrated) is formed to protect the build up layer 160 exposed to the outside from the etchant. The etching protective layer (not illustrated) suffers from the secondary etching process and is removed.

Figure 21:
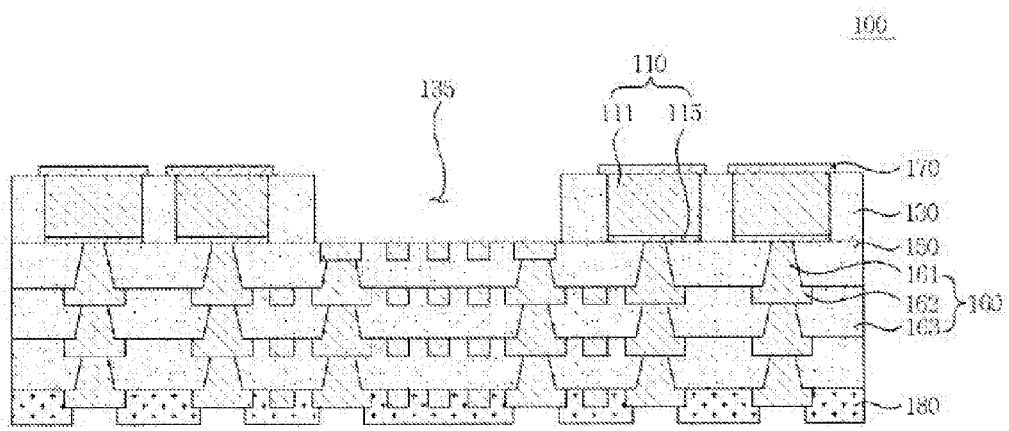

Referring to FIG. 21, the etching resist 430 is removed.

The package board 100 of FIG. 1 according to the exemplary embodiment of the present disclosure is formed by the processes of FIGS. 2 through 21.

FIG. 21 illustrates a state in which the up and down directions of FIG. 20 are changed. For convenience of explanation, FIGS. 2 through 20 illustrate a state in which the up and down directions of FIGS. 1 and 21 are changed. Therefore, the case in which the upper and lower portions of FIGS. 2 through 20 are changed to the lower and upper portion of FIGS. 1 and 21 will be described.

The exemplary embodiment of the present disclosure illustrates that the package board 100 is formed on one surface of the carrier substrate 500. However, the package board 100 may be simultaneously formed on both surfaces of the carrier substrate 500 by the same process. When the package board 100 is formed on both surfaces of the carrier substrate 500, two package boards 100 may be simultaneously formed.

Figure 22:
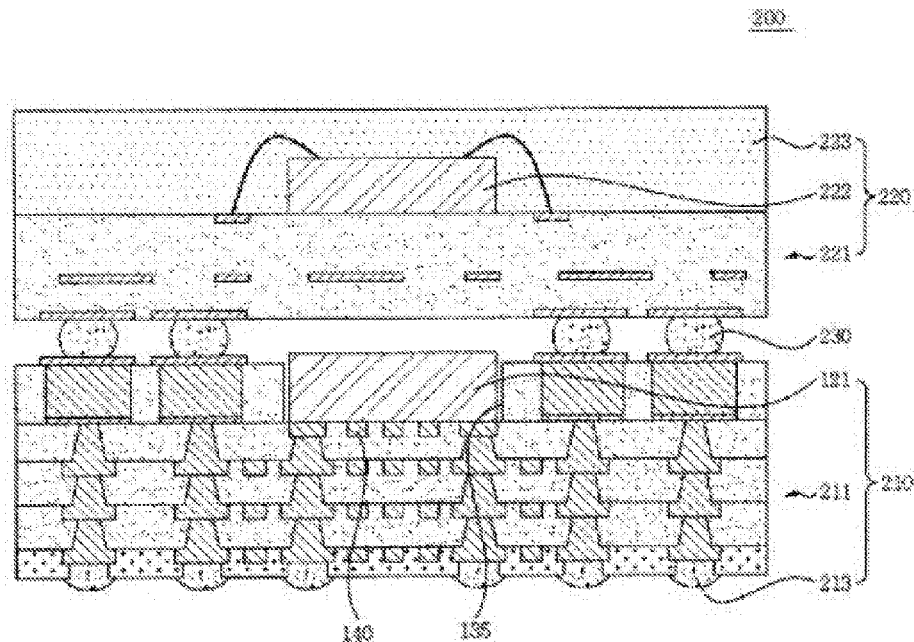
FIG. 22 is an exemplified diagram illustrating a package on package according to an exemplary embodiment of the present disclosure.

FIG. 22 is an exemplified diagram illustrating a package on package according to an exemplary embodiment of the present disclosure.

According to the exemplary embodiment of the present disclosure, the package on package 200 has a structure in which the upper package 220 is stacked on the lower package 210.

According to the exemplary embodiment of the present disclosure, the lower package 210 includes a lower package board 211 and a first electronic component 121.

According to the exemplary embodiment of the present disclosure, the lower package board 211 is the package board 100 of FIG. 1. Therefore, a detailed description of each configuration part of the lower package board 211 will refer to FIG. 1.

According to the exemplary embodiment of the present disclosure, the first electronic component 121 is inserted into and disposed in the cavity 135 of the lower package board 211. In this case, the first electronic component 121 is electrically connected to the lower package board 211 through the first circuit pattern 140. Although not illustrated in FIG. 22, a conductive adhesive or a conductive solder may be further formed between the first electronic component 121 and the first circuit pattern 140 for adhesion and electrical connection.

According to the exemplary embodiment of the present disclosure, the first electronic component 121 may be any kind of components which may be applied to the package field such as electronic devices.

According to the exemplary embodiment of the present disclosure, the first external connection terminal 213 is formed at the lower portion of the lower package 210.

For example, the first external connection terminal 213 is a solder ball. However, the first external connection terminal 213 is not necessarily a ball form. That is, if the first external connection terminal 213 is made of the conductive materials and thus is electrically connected to the lower package 210, a form of the first external connection terminal 213 is not limited.

According to the exemplary embodiment of the present disclosure, the upper package 220 includes an upper package board 221, a second electronic component 222, and a molding part 223.

According to the exemplary embodiment of the present disclosure, the upper package board 221 includes an insulating layer and a circuit pattern formed on the insulating layer. The second electronic component 222 is disposed on the upper package board 221.

According to the exemplary embodiment of the present disclosure, the second electronic component 222 may be any kind of components which may be applied to the package field such as electronic devices.

According to the exemplary embodiment of the present disclosure, the molding part 223 is formed at an upper portion of the upper package board 221 to cover the second electronic component 222. According to the exemplary embodiment of the present disclosure, the molding part 223 is formed to protect the second electronic component 222 from the outside. For example, the molding part 223 is made of epoxy molding compound (EMC), but is not necessarily limited thereto.

According to the exemplary embodiment of the present disclosure, the second external connection terminal 230 is formed between the upper package 220 and the lower package 210. The second external connection terminal 230 is bonded to the upper package 220 and the lower package 210, respectively, to electrically connect the upper package 220 to the lower package 210. For example, the second external connection terminal 230 is a solder ball. However, the second external connection terminal 230 is not necessarily a ball form. That is, if the second external connection terminal 230 is made of the conductive materials and thus is electrically connected to the upper package 220, a form of the second external connection terminal 230 is not limited.

According to the exemplary embodiment of the present disclosure, when the upper package 220 is stacked on the lower package 210, the first electronic component 121 is positioned inside the cavity 135 of the lower package board 211. In this case, the interval between the upper package 220 and the lower package 210 is narrower as much as a depth of the cavity 135 by the cavity 135. Further, the first connection pad 110 and the second connection pad 170 are formed at both sides of the cavity 135 to electrically connect the inside of the lower package 210 to the second external connection terminal 230. Therefore, even when the second external connection terminal 230 is formed as the solder ball having a small size, the upper package 220 may be connected to the lower package 210. As such, the second external connection terminal 230 is formed as the solder ball having a small size, and therefore a plurality of second external connection terminals 230 may be disposed at a micro interval. Further, since the second external connection terminal 230 is formed in a small size, it is possible to prevent or reduce the occurrence of defects due to a bridge between the second external connection terminals 230. Further, since the second external connection terminal 230 having a small size is used, the thickness of the package on package 200 may be reduced.

Although the embodiments of the present disclosure have been disclosed for illustrative purposes, it will be appreciated that the present disclosure is not limited thereto, and those skilled in the art will appreciate that various modifications, additions and substitutions are possible, without departing from the scope and spirit of the disclosure.

Accordingly, any and all modifications, variations or equivalent arrangements should be considered to be within the scope of the disclosure, and the detailed scope of the disclosure will be disclosed by the accompanying claims.

What is claimed is:

1. A package board, comprising:
   a first insulating layer having a cavity formed therein, the cavity penetrating through the first insulating layer;
   a first connection pad penetrating through the first insulating layer and formed to be spaced apart from an inner wall of the cavity; and
   a second insulating layer formed beneath the first insulating layer,
   wherein the first connection pad comprises:
   a metal post; and
   a barrier layer disposed between the metal post and the second insulating layer, bonded directly to a lower surface of the metal post, and made of a material different from that of the metal post.

2. The package board of claim 1, further comprising:
   a second connection pad formed on the first connection pad and the first insulating layer and formed to be exposed to the outside.

3. The package board of claim 2, wherein the second connection pad is formed to have a diameter larger than that of the first connection pad.

4. The package board of claim 1, further comprising:
   a first circuit pattern formed inside the second insulating layer.

5. The package board of claim 4, wherein an upper surface of the first circuit pattern is exposed to the outside by the cavity.

6. The package board of claim 1, further comprising:
   a build up layer formed under the first insulating layer.

7. A package on package, comprising:
   a lower package including a first insulating layer having a cavity formed therein, the cavity penetrating through the first insulating layer, a first connection pad penetrating through the first insulating layer and formed to be spaced apart from an inner wall of the cavity, a second insulating layer formed beneath the first insulating layer, and a first electronic component disposed in the cavity of the first insulating layer;
   an upper package formed on the lower package and including an upper package board and a second electronic component disposed on the upper package board; and
   an external connection terminal formed between the upper package and the lower package to make an electrical connection therebetween,
   wherein the first connection pad comprises:
   a metal post; and
   a barrier layer disposed between the metal post and the second insulating layer, bonded directly to a lower surface of the metal post, and made of a material different from that of the metal post.

8. The package on package of claim 7, further comprising:
a second connection pad formed on the first connection pad and the first insulating layer and formed to be exposed to the outside.

9. The package on package of claim 8, wherein the second connection pad is formed to have a diameter larger than that of the first connection pad.

10. The package on package of claim 7, further comprising:
a first circuit pattern formed inside the second insulating layer,
wherein an upper surface of the first circuit patter is exposed to the outside by the cavity.

* * * * *